US009722596B2

(12) United States Patent
Terenzi et al.

(10) Patent No.: US 9,722,596 B2
(45) Date of Patent: Aug. 1, 2017

(54) ELECTRONIC SWITCH, AND CORRESPONDING DEVICE AND METHOD

(71) Applicant: STMicroelectronics S.R.L., Agrate Brianza (IT)

(72) Inventors: Marco Terenzi, San Martino Siccomario (IT); Davide Ugo Ghisu, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/193,914

(22) Filed: Jun. 27, 2016

(65) Prior Publication Data

US 2017/0179943 A1   Jun. 22, 2017

(30) Foreign Application Priority Data

Dec. 22, 2015   (IT) ......................... 102015000086639

(51) Int. Cl.
*H03K 17/00*   (2006.01)
*H03K 17/16*   (2006.01)
*H03K 17/041*  (2006.01)
*H03K 5/08*    (2006.01)

(52) U.S. Cl.
CPC ............. *H03K 17/162* (2013.01); *H03K 5/08* (2013.01); *H03K 17/04106* (2013.01)

(58) Field of Classification Search
None
See application file for complete search history.

(56) References Cited

U.S. PATENT DOCUMENTS

| 4,808,859 | A  | * | 2/1989 | Even-or ............ H03K 17/6874 327/382 |
| 6,549,056 | B1 | * | 4/2003 | Mannonen ............ H03F 3/387 327/333 |
| 6,956,426 | B2 |   | 10/2005 | Wodnicki |

(Continued)

FOREIGN PATENT DOCUMENTS

WO            98/59421 A1       12/1998

OTHER PUBLICATIONS

Maxim Integrated, "High-Side, n-Channel MOSFET Switch Driver," MAX1614, Rev. 3, 2015, 9 pages.

(Continued)

*Primary Examiner* — Cassandra Cox
(74) *Attorney, Agent, or Firm* — Seed IP Law Group LLP

(57) ABSTRACT

A high-voltage electronic switch includes first and second transistors defining a current flow path between an input and output of the switch. The transistors have a common point of the current flow path and a common control terminal. A control circuit includes a voltage line receiving a limit operating voltage and first and second branches coupled between the voltage line and the common point and common control terminal, respectively. Further transistors are activated, upon turning-off of the first and second transistors, for coupling the branches to the voltage line. The branches include a parallel connected resistor, diode, and string of diodes with opposite polarities. The diode of the first branch plus string of diodes of the second branch and diode of the second branch plus string of diodes of the first branch provide coupling paths between the voltage line and, respectively, the common point and common control terminal.

20 Claims, 2 Drawing Sheets

(56) References Cited

U.S. PATENT DOCUMENTS

| 8,542,056 B2 | 9/2013 | Rossi et al. |
| 2012/0243712 A1* | 9/2012 | Yamada ........... H03K 17/08142 381/123 |
| 2012/0249216 A1 | 10/2012 | Ricotti et al. |
| 2013/0333741 A1* | 12/2013 | Doutreloigne .... H01L 31/02021 136/244 |
| 2016/0013655 A1* | 1/2016 | Zeltner ................ H03K 17/691 307/126 |
| 2016/0294384 A1* | 10/2016 | Schindler ......... H03K 17/04123 |

OTHER PUBLICATIONS

Jung et al., "Area-efficient high-voltage switch using floating control circuit for 3D ultrasound imaging systems," *Electronics Letters* 50(25):1900-1902, Dec. 2014, 2 pages.

Maxim Integrated, "MAX14802/MAX14803/MAX14803A—Low-Charge Injection, 16-Channel, High-Voltage Analog Switches," Data Sheet, 19-4484; Rev 4, 2013, 20 pages.

Supertex inc., "16-Channel, Low Harmonic Distortion, High Voltage Analog Switch with Bleed Resistors," Data Sheet, HV2733, 2011, 8 pages.

\* cited by examiner

ELECTRONIC SWITCH, AND CORRESPONDING DEVICE AND METHOD

BACKGROUND

Technical Field

The present disclosure relates to electronic switches.

One or more embodiments regard high-voltage electronic switches that can be used, for example, in ultrasound-imaging applications.

Description of the Related Art

High-voltage switches are components that enable setting-up of a connection or isolation between different electrical paths within systems which use signals that may, for instance, be higher than 10 V and enable passage of currents that may, for example, be higher than 1 A.

The fields of application for these components are multiple.

For instance, the capacity to withstand high working voltages, at the same time maintaining the same electrical characteristics of a classic low-voltage switch, renders electronic switches components of election for systems, such as diagnostic imaging systems both in the medical field (e.g., ultrasonography machines), and in the industrial field (e.g., in the vehicle sector or for seeking micro-cracks within solid bodies). These components may, on the other hand, also be used in a wide range of consumer applications, such as to require management of power signals.

As an alternative to electronic switches, it is possible to use mechanical switches. These, however, present a rather high encumbrance (and hence a large occupation of space) and a lower reliability as compared to switches, in particular high-voltage switches, obtained with solid-state components of semiconductor material, for example, silicon.

Manufacture of these devices is facilitated by technologies, such as BCD (Bipolar-CMOS-DMOS) technologies, which enable production of high-voltage (HV) components and at the same time enable management of low-voltage (LV) digital signals for control of the state of the switches.

In particular, in the case where input or output voltages that are negative with respect to ground, production of these devices is facilitated by the use of HV SoI (Silicon-on-Insulator) technologies in order to avoid the presence of potentially harmful parasitic components between the various switches.

BRIEF SUMMARY

One or more embodiments provide further improvements in the sector of electronic switches.

One or more embodiments regard a corresponding device (e.g., a switching device of the same type as those recalled in the introductory part of the present description) and a corresponding method.

The claims form an integral part of the technical teaching provided herein in relation to the embodiments.

One or more embodiments enable optimization of the step of turning-off of the switch by exploiting the positive and negative transitions of the input and output signals.

One or more embodiments enable increase of isolation as the slew rate of the signals applied increases, thus increasing isolation of the switch in conditions of maximum criticality.

The structure that can be obtained according to one or more embodiments does not have nodes sensitive to parasitic capacitances, there being, instead, the possibility of exploiting these factors in order to optimize operation of the switch, rendering the step of design and layout of the device simpler and without any risk of failure, associated, for example, to the off-state-driving block.

In one or more embodiments, driving of the control terminal (e.g., the gate) of the high-voltage devices does not require complex structures, it being possible for the control signal to can be obtained through current mirrors, without generating negative (and positive) reference voltages.

In one or more embodiments, the power consumed in the off state of the switch is practically zero.

One or more embodiments enable operation of each component within the voltage class for which it has been designed, eliminating the conditions of breakdown or deterioration over time.

One or more embodiments enable turning-off to be rendered effective for any value of the input voltage $V_{IN}$ comprised between supply values VPP and VNN.

In one or more embodiments, the turning-off condition is independent of the HV supply voltages used for supplying the driving structures of the switch (e.g., $V_{GS}$).

One or more embodiments enable creation of a structure that is not liable to create harmonic distortion on the signals when the switch is on.

BRIEF DESCRIPTION OF THE SEVERAL VIEWS OF THE DRAWINGS

One or more embodiments will now be described, purely by way of non-limiting example, with reference to the annexed drawings, wherein.

DETAILED DESCRIPTION

In the ensuing description various specific details are illustrated and aimed at providing an in-depth understanding of examples of one or more embodiments. The embodiments may be obtained without one or more of the specific details, or with other methods, components, materials, etc. In other cases, known structures, materials, or operations are not illustrated or described in detail so that various aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment.

The different topologies used for production of electronic switches, for example, of the high-voltage (HV) type, may depend upon the electrical characteristics that it is intended to obtain and upon the sphere of application for which they are designed.

Figure 1:
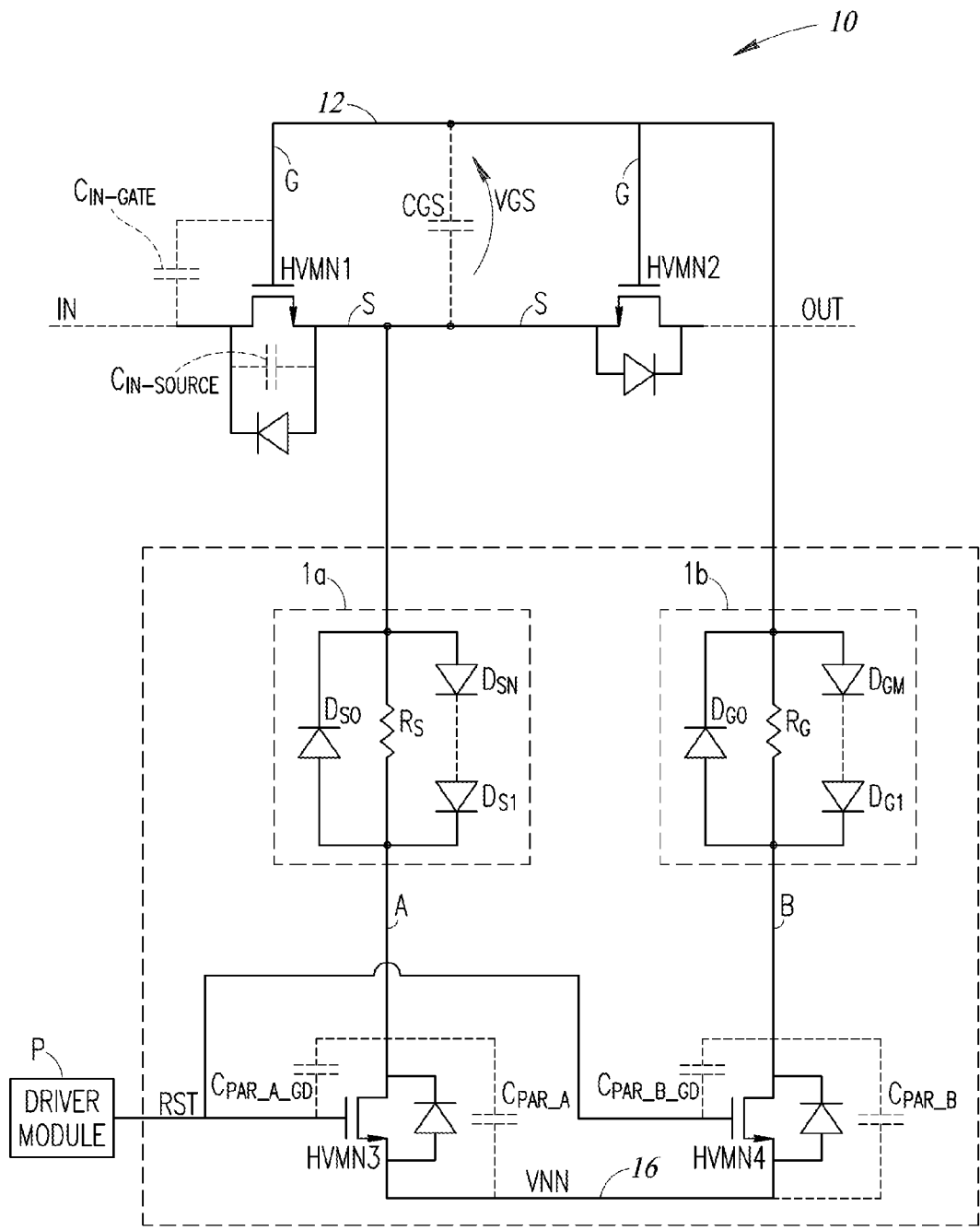
FIG. 1 is a circuit diagram exemplifying one or more embodiments.

As exemplified in FIG. 1, a structure that can be used to produce a switch 10 (e.g., an HV switch) may envisage use of two transistors HVMN1 and HVMN2 (e.g., N-channel power DMOS transistors).

By connecting together the current-source terminals S of the transistors HVMN1 and HVMN2 and doing the same also for the (gate) control terminals G, it is possible to obtain two common terminals GATE 12 and SOURCE 14 for driving simultaneously both of the devices HVMN1 and HVMN2, which are arranged in cascaded fashion (i.e., with the respective current paths, for example, drain-to-source and source-to-drain paths, in series with one another) between two terminals, an input terminal IN and an output terminal OUT, of the switch 10.

In this way, the current flow path between the terminals IN and OUT may be conductive (on) or non-conductive (off) according to whether the two transistors HVMN1 and HVMN2 are conductive or non-conductive.

The control terminal 12 may be driven by a driver module (not visible in the figures), provided in the device in which the switch is mounted. The corresponding driving action may be performed according to known criteria, which renders superfluous a more detailed description herein.

The main advantage of these devices is represented by the high switching rate and by the good efficiency also at low power levels. The high breakdown voltage and the low resistance in triode conditions $R_{ON}$ renders the component ideal for providing integrated HV switches, especially within low-power-consumption systems.

Proper operation of the switch is facilitated by the capacity of the transistors (e.g., HVMN1 and HVMN2) to withstand high voltage levels. For example, in the case where the switch 10 is off, the value of voltage applied at the input may differ from the output by the maximum peak-to-peak voltage ($V_{IN_{PK-PK}}$) of the input signal.

Any possible breakdown of the device may be prevented by getting the maximum voltage $V_{IN_{PK-PK}}$ to coincide with or be lower than the voltage class of the HV MOSFETs used.

Considering the voltages involved and the interest in having a low resistance $R_{ON}$ in the case where the switch is on, the MOS transistors used may be of large size so as to be able to withstand high signal currents, remaining in the triode zone. For example, N-channel HV MOSFETs may represent a good choice since they enable all the electrical characteristics just described to be achieved, occupying a smaller area on silicon as compared to P-channel HV MOSFETs.

A structure of the type described above may be driven by circuit blocks, which control the voltages at the common terminals GATE and SOURCE, enabling proper biasing of the state.

The on state of the switch can be established by bringing the gate voltage of the two HV MOSFETs to a value higher than the source voltage by at least a threshold voltage $$V_{GS_{ON}} \rightarrow V_{GS} > V_{TH}$$

where $V_{GS}=V_G-V_S$, and $V_{TH}$ is the threshold voltage.

Since the source forms part of the path between the input terminal IN and the output terminal OUT of the switch, this node may follow the input signal HV and be able to follow all the entire input dynamics. Likewise, also the gate node may be able to fluctuate freely so as to be able to maintain the correct on-state gate-to-source voltage $V_{GS_{ON}}$. This effect can be obtained by charging the parasitic capacitance $C_{GS}$ (represented dashed) between the two terminals GATE and SOURCE. This capacitance is mainly made up of the parasitic capacitances of the MOSFETs $C_{GS_{HVMN1}}$ and $C_{GS_{HVMN2}}$, which help to keep the state stored.

The off condition of the switch 10 may be obtained by driving the two nodes GATE and SOURCE in order to obtain $$V_{GS_{OFF}} \rightarrow V_{GS} \leq 0V$$

A good off-state-driving circuit enables maintenance of the off state in a stable and constant way even in the presence of input signals with high voltage and high slew rate SR. This condition may be important above all in the presence of high-voltage negative input signals.

To achieve the off condition of the switch, it is possible to resort to various circuit solutions.

A first solution, as described, for example, in US 2012/0249261 A1, consists in pre-charging of the capacitance $C_{GS}$ in an opposite way with respect to the on condition, i.e., setting the source at a voltage higher than the gate by a value that satisfies the relation $V_G \leq V_S \leq V_G + |V_{GS_{MAX}}|$, where $|V_{GS_{MAX}}|$ represents the highest value of $|V_{GS}|$ (in modulus) allowed by the technology without breakdown or deterioration of the component. During the switchings of $V_{IN}$, both of the nodes remain disconnected from any reference in voltage and can hence float following upon sudden variations of the signals across the switch.

The main disadvantages of this solution are due to the negative impact that the parasitic capacitances in the gate and source nodes have in keeping stable the off state of the switch, to the worsening of the harmonic distortion due to the modulation of the gate-to-source voltage $V_{GS}$, and to the critical working conditions of some high-voltage components, which may undergo very repetitive electronic stresses that may even cause breakdown of the component.

Also to be taken into account is the need to know the biasing beforehand so as to be able to pre-charge the voltage $V_{GS}$ correctly. This condition is not always satisfied in applications in general.

Typically, the values allowed for the signal at input to the switch cannot exceed the HV voltages used within the driver circuits.

A second solution, which is described, for example, in S-J Jung et al.: "Area-efficient high-voltage switch using floating control circuit for 3D ultrasound imaging systems"— ELECTRONICS LETTERS, Dec. 4, 2014, Vol. 50, No. 25, pp-1900-1902 consists in forcing the gate and source nodes to one or more reference voltages (typically the lowest of the device). In the case where both of the nodes are biased at the most negative voltage of the circuit (VNN), turning-off of the switch may be obtained with $$V_G=V_S=VNN \rightarrow V_{GS}=0V$$

The voltage VNN reverse biases the body-drain diodes of the transistors HVMN1 and HVMN2, ensuring constant and independent isolation from the voltage present at input to the circuit.

The main disadvantage of this solution is represented by the considerable sensitivity in maintaining the off state following upon fast edges of the input signal.

A possible variant of this solution consists in biasing the source node at VNN and the gate at a voltage higher than $V_S=VNN$ $$VNN < V_G \leq VNN + |V_{GS_{MAX}}|$$

thus obtaining an off state that is more robust in regard to couplings with the input signal thanks to a negative gate-to-source voltage $V_{GS}$ $$0 < V_{GS} \leq -|V_{GS_{MAX}}|$$

This technique in any case does not altogether solve coupling and requires protection circuits in order not to stress the components used for generation of the references.

These two solutions may prove more robust to the parasitic capacitances as compared to the solution described previously.

Finally, for some topologies, stable maintenance of the state of the switch may imply a constant consumption from the HV supplies, which increases the power dissipated by the circuit as a whole.

One or more embodiments enable solution of the problems outlined above, for example in circuits with negative input voltages.

One or more embodiments may envisage recourse to an off-state-driving block according to the solution exemplified in FIG. 1.

In one or more embodiments, the control circuit in question may use two further transistors (e.g., two high-voltage MOSFETs HVMN3 and HVMN4), driven by a common signal RST applied to the (gate) control terminals of the transistors HVMN3 and HVMN4, so as to be able to connect two nodes A and B (e.g., on the drains of HVMN3 and HVMN4) to a voltage line 16 that is to be coupled to a source (comprised in the device in which the switch is mounted and not visible in the figures), which supplies a limit operating voltage. This may, for example, be a negative voltage, which may correspond to the voltage VNN, i.e., to the lowest voltage of the circuit, already referred to previously.

In one or more embodiments, the signal RST can be generated via a driver module P, which is in itself known, this rendering superfluous a more detailed description herein. The module P may be able to activate the further transistors HVMN3, HVMN4 upon turning-off of the "main" transistors HVMN1 and HVMN2 in order to couple the respective branch 1a, 1b of the control circuit to the voltage line 16.

In one or more embodiments, the transistor HVMN3 can be coupled to the terminal or point SOURCE (designated by 14) via a first circuit branch 1a, which may comprise a connection in parallel of:
- a resistance $R_S$;
- a diode (e.g., a low-voltage diode) $D_{S0}$ connected to HVMN3 (node A) via the anode, whereas the cathode is connected to the node S, for example, via the source; and
- a string of N diodes (N>1) connected together in series and with their cathodes set facing the node A.

In one or more embodiments, the transistor HVMN4 may be coupled to the branch GATE (designated by 12) via a second circuit branch 1b, which may comprise a connection in parallel of:
- a resistance $R_G$;
- a diode $D_{G0}$ with its cathode connected to the node B; and
- a string of M diodes connected together in series and with their cathodes se facing the control (gate) terminals of the two "main" transistors HVMN1 and HVMN2 that form the switch 10 according to the criteria exemplified previously.

In one or more embodiments, the circuit exemplified in FIG. 1 may operate according to the modalities described hereinafter.

During the on state (switch conductive), the signal RST (which may be a logic signal, e.g., high/low) referenced around the value VNN goes to a low level (e.g., VNN), keeping the transistors HVMN3 and HVMN4 off.

In this way, the nodes A and B can follow the entire dynamics of the input signal applied, with a voltage class of the HV MOSFETs HVMN1 and HVMN2 that is equal to or higher than (VPP+|VNN|).

During the off state, the signal RST may be at a high level so as to turn on the transistors HVMN3 and HVMN4, in order to bring the nodes A and B to the voltage VNN, in d.c. conditions, with the two resistances $R_S$ and $R_G$ that are such as to achieve $$V_G=V_S=VNN \rightarrow V_{GS}=0V$$

One or more embodiments may intrinsically facilitate regeneration of the off state, with an efficiency proportional to the slew rate of the input signal.

Figure 2:
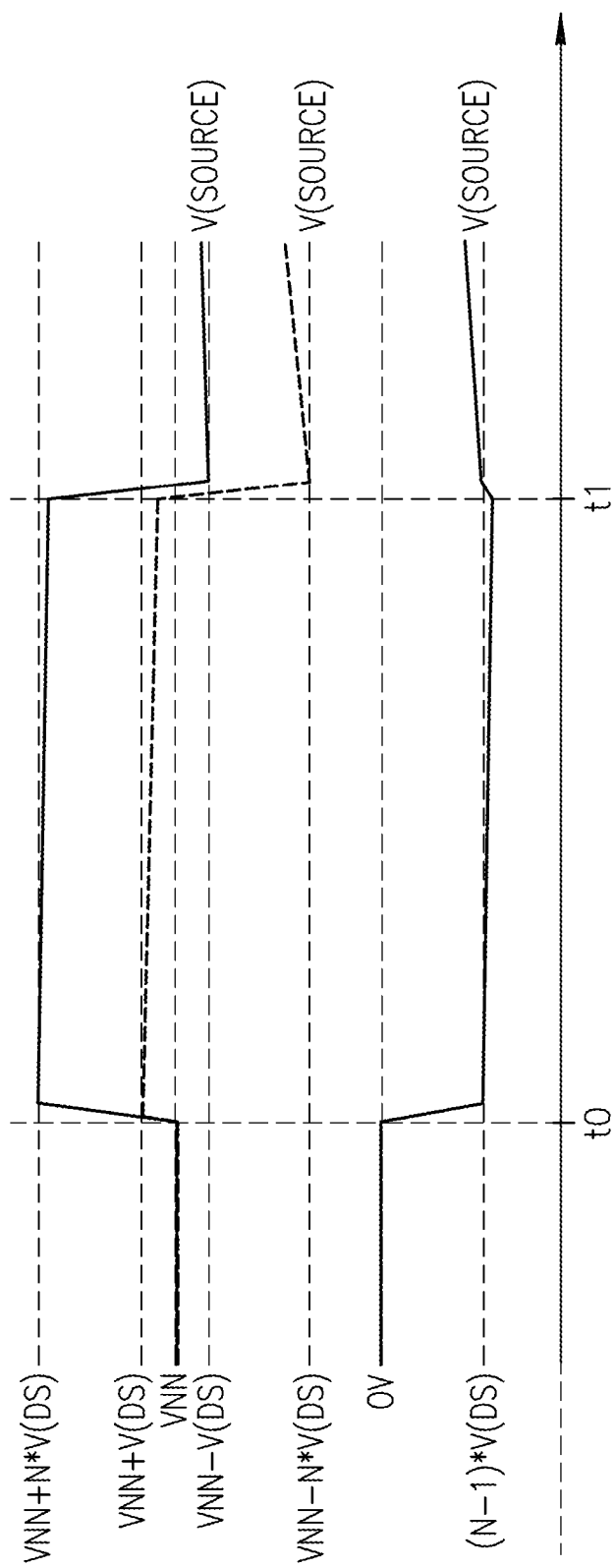
FIG. 2 exemplifies possible timing charts of signals in some embodiments.

The chronograms of FIG. 2 exemplify conditions of operation where there is applied on the input IN a square wave of amplitude comprised between VNN and VPP, where VPP is the highest HV voltage that it is assumed that the switch 10 is able to withstand. It may, for example, be the HV supply of the on-state-driving block.

Following upon a transition of the input signal, the drain-to-source ($C_{IN-SOURCE}$) and drain-to-gate ($C_{IN-GATE}$) parasitic capacitances of the transistor HVMN1 (see FIG. 1) operate in such a way as to cause the nodes GATE 12 and SOURCE 14 to follow in a.c. conditions the input node IN (but for a capacitive partition). In itself, such a variation of voltage on the two control nodes is not easy to handle, in so far as it may depend both upon the parasitic structures of the components used and upon the ones introduced in the stage of layout of the device. This effect may produce a variation of the voltage $V_{GS}$, with the possibility of obtaining an undesired change of state of the switch 10 following upon a transition of the input signal. In general, a reduction of the input voltage corresponds to a drop in the voltages $V_{GATE}$ and $V_{SOURCE}$ and vice versa.

In one or more embodiments, this problem can be tackled with the circuits 1a and 1b.

During the positive transition of the input signal at time $t_0$ (see FIG. 2) both the voltage on the gates of the two transistors HVMN1, HVMN2 and the voltage on their sources undergo an increase in their nominal value. This variation forward biases (direct polarization) the diode $D_{G0}$ and the string of diodes $D_{S1-SN}$, clamping the variation of voltage of the two nodes to the values $$V_{GATE\uparrow}=VNN+V_{DS_{HVMN34}}+V_{D_{G0}}$$

$$V_{SOURCE\uparrow}=VNN+V_{DS_{HVMN34}}+\Sigma_{x=1}^{N}V_{D_{Sx}}$$

with $V_{DS_{HVMN3}}=V_{DS_{HVMN4}}=V_{DS_{HVMN34}}$.

Considering now the instant at which the input signal produces a negative transition (instant $t_1$ in FIG. 2), the nodes GATE 12 and SOURCE 14 decrease until they cause forward biasing of the body-to-drain diodes of the transistors HVMN3 and HVMN4, the diode $D_{S0}$, and the string of diodes $D_{G1-GN}$, with the two voltages hence clamped at the values $$V_{SOURCE\downarrow}=VNN-V_{D_{HVMN34}}-V_{D_{S0}}$$

$$V_{GATE\downarrow}=VNN-V_{D_{HVMN34}}+\Sigma_{x=1}^{N}V_{D_{Gx}}$$

In both cases, the above effect intrinsically implies $V_G<V_S$. Moreover, by confining all the nodes of the structure to a minimum value of $VNN-V_{D_{HVMN34}}+\Sigma_{x=1}^{N}V_{D_{Gx}}$ it is possible to obtain an adequate safety for the components used.

Thanks to the limitations in voltage that may be introduced in one or more embodiments, the control voltage of the switch not only does not change the state of the switch, but further reduces the voltage $V_{GS}$ to values lower than 0 V, facilitating making turning-off more robust in respect of the d.c. turning-off value.

It will be appreciated that the same principle applies also considering the effect of an external HV signal applied to the output node OUT of the switch 10.

One or more embodiments may draw benefit from the fact that the "parasitic" capacitances produced by the transistors HVMN3 and HVMN4 on the nodes A and B may be rendered substantially identical. This result may be achieved by providing the two components with substantially the same area $$W_{HVSW1}=W_{HVSW2}$$

$$L_{HVSW1}=L_{HVSW2}$$

In this way, it is possible to make it easier to obtain the same current capacity and a consequent symmetry of the effects both on the node GATE 12 and on the node SOURCE 14.

Moreover, in one or more embodiments, the parasitic capacitances $C_{PAR\_A}$, $C_{PAR\_B}$ and the capacitances $C_{PAR\_A\_GD}$ and $C_{PAR\_B\_GD}$ (see FIG. 1), amplified by the Miller effect on the nodes A and B, make it possible not only to get the circuits 1a and 1b to intervene more rapidly, but also to protect the low-voltage control signal RST by undesired voltage peaks.

One or more embodiments may involve a sizing of the two transistors HVMN1, HVMN2 founded, for example, on a synthesis between area occupation, maximum turning-off time, and robustness to transitions of the high-voltage signals across the switch.

The choice of the values that can be attributed to the resistances $R_S$ and $R_G$ can affect the performance of the turning-off driver in two different temporal phases.

For instance, a first phase may be at the transition of state from on to off. In fact, when the MOSFETs HVMN3 and HVMN4 have just turned on, they start to discharge the parasitic capacitances $C_{PAR\_A}$ and $C_{PAR\_B}$, and the current starts to flow in the two resistances, the voltage across the structures 1a and 1b being initially zero. Since the current of the resistances is inversely proportional to the value of $R_S$ and $R_G$, the voltage at the control nodes decreases in a time depending upon the two passive components. For instance, in the condition $R_S=R_G$, the charge associated to the nodes SOURCE 14 and GATE 12 can decrease in the same way, initially keeping the value of $V_{GS}$ constant in conditions of switch in the on state. By choosing instead $R_S>R_G$, it is possible to cause the gate voltages of the transistors HVMN1 and HVMN2 to decrease more rapidly than the source voltages, accelerating turning-off of the switch. Once the voltage at the node A drops with respect to that on the node SOURCE by $\Sigma_{x=1}^{N}V_{D_{Sx}}$ and the voltage at the node B drops with respect to that on the node GATE by $V_{D_{G0}}$, the discharge current starts to pass through the diodes, reducing $V_S$ and $V_G$ with a current equal to the maximum current capacity of the turning-off HV MOSFETs.

A second phase may, instead, arise in conditions of the switch 10 in the off state ($V_G=V_S=$VNN) and in concomitance with a variation of the input signal. Once the diodes of the circuits 1a and 1b limit the variation of the nodes SOURCE 14 and GATE 12 to the values described previously, the resistances $R_S$ and $R_G$ start to bring the control voltages of the switch back to the initial values. Consequently, the choice of the values to be attributed to the passive components may make it possible to be set up, together with the parasitic capacitances $C_{GATE}$ and $C_{SOURCE}$, the discharge time of the two nodes. The choice of a not excessively low value of these capacitances enables maintenance of a negative control voltage for the longest time possible. For instance, in one or more embodiments, it is possible to choose these values so as to privilege maintenance of the voltage $V_{GS_{OFF}}$ during the most critical transition of the input signal. Assuming, as in FIG. 2, that the critical transition is in concomitance with the positive edge of the input signal, it is possible to choose $R_S>R_G$ so as to maintain the control voltage negative for a longer time given that discharge of the voltage GATE is faster than that of the voltage SOURCE.

It will be appreciated that one or more embodiments may envisage (purely by way of illustrative and non-limiting example):

- the possible choice of polarities of components and/or of signals in time (e.g., positive/negative) complementary to those presented herein by way of example, with consequent possible adoption both of polarities of connection (e.g., location of anode and cathode) and of polarities of components (e.g., N type or P type) complementary, accordingly, to the ones exemplified herein; and/or
- the possible replacement of transistors exemplified herein as field-effect transistors (e.g., MOSFETs) with bipolar transistors or other similar components, where:
  - the current path between the current-source terminal and the current-drain terminal, represented in a FET by the source-to-drain path, is represented by emitter-collector path, and/or
  - the control terminal, represented in a FET by the gate, is represented by the base.

One or more embodiments may consequently provide an electronic switch that can be operated with a limit operating voltage (e.g., a negative voltage, VNN), the switch comprising:

a first transistor and a second transistor (e.g., HVMN1 and HVMN2) arranged in cascaded fashion so as to provide a current flow path between an input terminal and an output terminal of the switch, the first and second transistors having between them a common point (e.g., S, 14) of the current flow path and a common control terminal (e.g., G, 12) for rendering the current flow path conductive and non-conductive by turning on and turning off the first and second transistors;

a control circuit, comprising a voltage line (e.g., 16), which can be coupled to said limit operating voltage (e.g., VNN), and comprising a first branch (e.g., 1a) between said voltage line and said common point and a second branch (e.g., 1b) between said voltage line and said common control terminal, wherein each said first and second branch:

a) is coupled to a further transistor (e.g., HVMN3, HVMN4) that can be activated, upon turning-off of the first and second transistors, for coupling the respective branch of the control circuit to said voltage line; and b) comprises parallel connection of a resistor (e.g., $R_S$, $R_G$), a diode (e.g., $D_{S0}$; $D_{G0}$), and a string of diodes (e.g., $D_{S1\text{-}SN}$; $D_{G1\text{-}GN}$), with said diode and said string of diodes that have opposite polarities (i.e., position of their anode with respect to their cathode), so that the diode in the first branch plus the string of diodes in the second branch and the diode in the second branch plus the string of diodes in the first branch provide forward-biasing (direct polarization) coupling paths (with the anode at a higher voltage than the cathode) between said voltage line and, respectively, said common point and said common control terminal.

In one or more embodiments, the resistors may have one and the same value for the first branch and for the second branch.

In one or more embodiments, the resistor in the first branch may have a higher value than the resistor in the second branch.

In one or more embodiments, the further transistors may substantially have the same area for the first branch and for the second branch.

In one or more embodiments, the first transistor and the second transistor have current-source terminals (e.g., source S) coupled together at the common point.

In one or more embodiments:

the diode ($D_{SO}$) in the first branch (1a) and the diode ($D_{G0}$) in the second branch (1b) can have their cathodes set facing, respectively, the common point and the voltage line; and the diodes in the string of diodes in the first branch and the diodes in the string of diodes in the second branch can have their cathodes set facing, respectively, the voltage line and the common point.

In one or more embodiments, the transistors may be field-effect transistors, optionally N-channel MOSFETs.

In one or more embodiments, a device comprising an electronic switch of the type exemplified herein that is able to provide a current flow path in the device may comprise:

a source of the limit operating voltage (e.g., VNN), which is preferably negative, coupled to the voltage line; and a driver device (e.g., the module P) for activating the further transistors in the first and second branches upon turning-off of the first and second transistors in order to couple the respective branch (1a, 1b) of the control circuit to the voltage line (16).

In one or more embodiments, a method of operation of an electronic switch of the type exemplified herein may envisage activation of the further transistors coupled to the first and second branches by coupling the respective branch of the control circuit to the voltage line upon turning-off of the first and second transistors.

Without prejudice to the underlying principle, the details of construction and the embodiments may vary, even significantly, with respect to what has been illustrated herein purely by way of non-limiting example, without thereby departing from the extent of protection of the present invention, which is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic switch operable with a limit operating voltage, the switch including:

a first transistor and a second transistor in a cascaded arrangement to provide a current flow path between an input terminal and an output terminal of the switch, the first and second transistors having a common point of said current flow path between them and a common control terminal for making the current flow path conductive and non-conductive by turning the first and second transistors on and off;

a control circuit with a voltage line coupleable to a limit operating voltage, a first branch coupled between said voltage line and said common point and a second branch coupled between said voltage line and said common control terminal; wherein each said first and second branch is coupled to a further transistor activatable upon turning off the first and second transistors for coupling the respective branch of the control circuit to said voltage line, and wherein each branch includes a parallel coupling of a resistor, a diode and a string of diodes, with said diode and said string of diodes having opposed polarities; and wherein the diode in said first branch plus the string of diodes in said second branch and the diode in said second branch plus the string of diodes in said first branch provide direct polarization paths between said voltage line and said common point and said common control terminal, respectively.

2. The electronic switch of claim 1 wherein said resistor has a same value in said first branch and in said second branch.

3. The electronic switch of claim 1 wherein said resistor in said first branch has a higher value than said resistor in said second branch.

4. The electronic switch of claim 1 wherein said further transistor has substantially the same area for said first branch and for said second branch.

5. The electronic switch of claim 1 wherein the first transistor and the second transistor have current source terminals mutually coupled at said common point.

6. The electronic switch of claim 1 wherein:

the diode in said first branch and the diode in said second branch have their cathodes towards said common point and towards said voltage line, respectively; and the diodes in the string diodes in said first branch and the diodes in the string of diodes in said second branch have their cathodes towards said voltage line and towards said common point, respectively.

7. The electronic switch of claim 1 wherein said transistors include field effect transistors.

8. The electronic switch of claim 7, wherein the field effect transistors comprise N-channel MOSFETs.

9. An electronic device, comprising:

an electronic switch configured to provide a current flow path between and input node and an output node in the electronic device, the electronic switch including:

first and second transistors coupled in series between the input and output nodes provide a current flow path between the input and output nodes of the switch, the first and second transistors having a common signal node in the current flow path defined at the interconnection between the transistors and having a common control node configured to receive a control signal to turn the first and second transistors on and off;

a control circuit having a voltage line node configured to receive to a limit operating voltage and including a first branch circuit coupled between the voltage line node and the common signal node and a second branch circuit coupled between the voltage line node and the common control node, each of the first and second branch circuits coupled to a third and fourth transistor, respectively, the third and fourth transistors configured, responsive to the control signal turning off the first and second transistors, to couple the corresponding first and second branch circuits to the voltage line node, each of the first and second branch circuits including a parallel coupled resistive element, rectification element, and string of rectification elements, wherein for each branch circuit the corresponding rectification element is coupled antiparallel with the corresponding string of rectification elements; and wherein the rectification element in the first branch circuit and the string of rectification elements in the second branch circuit couple the common signal node and the common control node to the voltage line node, respectively, responsive to a transition of an input signal on the input node from a first level to a second level, and the rectification element in the second branch circuit and the string of rectification elements in the first branch circuit couple the common signal node and the common control node to the voltage line, respectively, responsive to a transition of the input signal on the input node from the second level to the first level; and a driver circuit configured, responsive to the control signal turning off the first and second transistors, to activate the third and fourth transistors to thereby couple the first and second branch circuits of the control circuit to the voltage line node.

10. The electronic device of claim 9, wherein the electronic switch is further configured to receive a second input signal on the output node of the electronic device and wherein the control circuit is further configured to control the voltages on the common control node and the common signal node in the same way responsive to transitions of the second input signal between third and fourth levels.

11. The electronic device of claim 9 further comprising a voltage source coupled to the voltage line node to provide the limit operating voltage.

12. The electronic device of claim 9, wherein each of the rectification elements comprises a diode.

13. The electronic device of claim 9, wherein the electronic device comprises one of an ultrasound imaging system and an industrial imaging system for providing images showing micro-cracks solid bodies.

14. The electronic device of claim 9, wherein the resistive element in the first branch circuit has a value that is either approximately equal to the resistive element in the second branch circuit or is greater than the value of the resistive element in the second branch circuit.

15. The electronic device of claim 9 wherein the first and second transistor comprise either field effect transistors or bipolar transistors.

16. A method of controlling an electronic switch, comprising:

limiting a value of a voltage on a common control node of the electronic switch to a first value or a second value, the electronic switch including a first transistor and a second transistor coupled in series between an input node and an output node, wherein the voltage on the common control node is limited, when the first and second transistors are turned off, to the first value responsive to a transition of an input signal on the input node from a first level to a second level and is limited to the second value responsive to a transition of an input signal from the second level to the first level;

limiting a value of a voltage on a common signal node defined at the interconnection of the first and second transistors to a third value or a fourth value, the common signal node being a node in a current path between the input and output nodes and the voltage on the common signal node being limited to the third value responsive to a transition of the input signal from the first level to the second level and the voltage of the common signal node being limited to the fourth value responsive to a transition of the input signal from the second level to the first level;

wherein limiting the value of the voltage on the common control node to the first value comprises forward biasing a first diode coupled between a limit voltage node receiving a limit voltage and the common control node;

wherein limiting the value of the voltage on the common signal node to the third value comprises forward biasing a first plurality of diodes coupled between the limit voltage node and the common signal node, the third value having a value relative to the first value on the common control node to keep the first and second transistors turned off;

wherein limiting the value of the voltage on the common control node to the second value comprises forward biasing a second plurality of diodes coupled between the limit voltage node and the common control node; and wherein limiting the value of the voltage on the common signal node to the fourth value comprises forward biasing a second diode coupled between the limit voltage node and the common signal node, the fourth value having a value relative to the second value on the common control node to keep the first and second transistors turned off.

17. The method of claim 16 further comprising:

coupling a first resistance in parallel with the first diode and the second plurality of diodes between the common control node and the limit voltage node; and coupling a second resistance in parallel with the second diode and the first plurality of diodes between the common signal node and the limit voltage node.

18. The method of claim 17 further comprising:

coupling the first resistance, first diode and second plurality of diodes through a third transistor to the limit voltage node; and coupling the second resistance, second diode and first plurality of diodes through a fourth transistor to the limit voltage node.

19. The method of claim 18 further comprising turning on the third and fourth transistors responsive to the first and second transistor being turned off.

20. The method of claim 19 further comprising supplying a negative reference voltage as the limit voltage on the limit voltage node.

* * * * *